(12) United States Patent
Kim (10) Patent No.: US 8,773,960 B2
(45) Date of Patent: Jul. 8, 2014

(54) PHOTODETECTOR UNIT, OPTICAL PICKUP INCLUDING THE PHOTODETECTOR UNIT, AND OPTICAL SYSTEM INCLUDING THE OPTICAL PICKUP

(71) Applicant: Young-taek Kim, Seoul (KR)

(72) Inventor: Young-taek Kim, Seoul (KR)

(73) Assignee: Toshiba Samsung Storage Technology Korea Corporation, Suwon-si (KR)

( * ) Notice: Subject to any disclaimer, the term of this patent is extended or adjusted under 35 U.S.C. 154(b) by 0 days.

(21) Appl. No.: 13/760,128

(22) Filed: Feb. 6, 2013

(65) Prior Publication Data
US 2013/0205309 A1 Aug. 8, 2013

(30) Foreign Application Priority Data
Feb. 7, 2012 (KR) .................. 10-2012-0012538

(51) Int. Cl.
*G11B 7/00* (2006.01)
(52) U.S. Cl.
USPC ...................................... 369/44.14
(58) Field of Classification Search
USPC ............ 369/44.11, 44.14, 112.01; 250/208.2; 720/659
See application file for complete search history.

(56) References Cited

U.S. PATENT DOCUMENTS

| | | | | |
|---|---|---|---|---|
| 7,471,595 B2 * | 12/2008 | Yoon et al. | .................. | 369/44.12 |
| 8,054,731 B2 * | 11/2011 | Kawasaki et al. | ......... | 369/112.01 |
| 2001/0027873 A1* | 10/2001 | Miyake | .......................... | 174/250 |
| 2008/0080356 A1* | 4/2008 | Sekine et al. | ............ | 369/112.23 |
| 2012/0147726 A1* | 6/2012 | Nakata et al. | ............ | 369/112.24 |

FOREIGN PATENT DOCUMENTS

| | | | | |
|---|---|---|---|---|
| JP | 2004-221124 | | 8/2004 | |
| JP | 2004221124 A | * | 8/2004 | .............. H01L 23/12 |
| KR | 10-0406810 | | 11/2003 | |
| KR | 10-2010-0071653 | | 6/2010 | |

OTHER PUBLICATIONS

Korean Office Action issued Feb. 4, 2013 in counterpart Korean Patent Application No. 10-2012-0012538 (4 pages, in Korean).

* cited by examiner

*Primary Examiner* — Brenda Bernardi
(74) *Attorney, Agent, or Firm* — NSIP Law (57) ABSTRACT

Provided is a photodetector unit including a photodetector integrated circuit (PDIC). The photodetector may reduce a height of a conventional optical pickup by improving the input/output terminals of the PDIC and accordingly improving the contact points and wires of a corresponding printed circuit board (PCB).

20 Claims, 7 Drawing Sheets

PHOTODETECTOR UNIT, OPTICAL PICKUP INCLUDING THE PHOTODETECTOR UNIT, AND OPTICAL SYSTEM INCLUDING THE OPTICAL PICKUP

CROSS-REFERENCE TO RELATED APPLICATION(S)

This application claims the benefit under 35 USC §119(a) of Korean Patent Application No. 10-2012-0012538, filed on Feb. 7, 2012, in the Korean Intellectual Property Office, the entire disclosure of which is incorporated herein by reference for all purposes.

BACKGROUND

1. Field

The following description relates to a photodetector unit of an optical pickup that has a reduced height due to an improvement in an input/output terminal arrangement.

2. Description of Related Art

Optical pickups record and reproduce data to and from an information storage medium by condensing light emitted from a light source, focusing the light on the information storage medium, and receiving the light reflected by the information storage medium using a photodetector. For slim-type optical disc drives, it is desirable for optical pickups to be slim to further reduce the amount of parts and space needed to house the optical pickup.

To apply an optical pickup to slim apparatuses such as ultra books, there is a limit in the height of the optical pickup. Therefore, there is a desire to reduce the height of the optical pickup to make the optical pickup more compatible with slim apparatuses.

SUMMARY

In an aspect, there is provided a photodetector integrated circuit (PDIC) for an optical pickup, the PDIC including a light-receiving portion comprising a main light-receiving part and sub light-receiving parts respectively disposed on opposing sides of the main light-receiving part, each of the main light-receiving part and the sub light-receiving parts comprising a plurality of sectional light-receiving areas, and a plurality of lands which output a detection signal of light detected by each of the sectional light-receiving areas of the main light-receiving part and the sub light-receiving parts, wherein the plurality of lands are arranged to form two lateral lines in a height direction of the optical pickup.

The PDIC may further comprise a printed circuit board (PCB) which is coupled to the PDIC so as to contact the plurality of lands.

The PCB may comprise a flexible PCB.

The PCB may comprise a plurality of contact points that contact the plurality of lands, and wires formed on the PCB to connect the plurality of contact points to an external circuit may extend in a lateral direction that is perpendicular to the height direction of the optical pickup.

The PCB may comprise a plurality of contact points that contact the plurality of lands, and some of a plurality of wires formed on the PCB to connect the plurality of contact points to an external circuit may extend in a lateral direction that is perpendicular to the height direction of the optical pickup, and the remaining wires may extend in a second direction opposite to a first direction corresponding to a direction toward an objective lens of the optical pickup.

The plurality of contact points may be formed in two lines that face the plurality of lands, wires extending from contact points arranged on a line that is closer to the objective lens may extend in the lateral direction, and wires extending from contact points arranged on a line that is farther from the objective lens may extend in the second direction.

A height of the optical pickup may be 1.75 mm or less.

In an aspect, there is provided an optical pickup including a light source, an objective lens which focuses light emitted from the light source on an information storage medium, and a photodetector unit which receives light reflected by the information storage medium to detect an information signal and/or an error signal, wherein the photodetector unit comprises a photodetector integrated circuit (PDIC) comprising a light-receiving portion which comprises a main light-receiving part and sub light-receiving parts respectively disposed on opposing sides of the main light-receiving part, the main light-receiving part and the sub light-receiving parts each comprising a plurality of sectional light-receiving areas, and a plurality of lands which output a detection signal of light detected by each of the sectional light-receiving areas of the main light-receiving part and the sub light-receiving parts, and the plurality of lands are arranged to form two parallel lines in a height direction of the optical pickup.

The photodetector unit may further comprise a printed circuit board (PCB) which is coupled to the PDIC so as to contact the plurality of lands.

The PCB may comprise a flexible PCB.

The PCB may comprise a plurality of contact points that contact the plurality of lands, and wires formed on the PCB to connect the plurality of contact points to an external circuit may extend in a lateral direction that is perpendicular to the height direction of the optical pickup.

The PCB may comprise a plurality of contact points that contact the plurality of lands, and some of a plurality of wires formed on the PCB to connect the plurality of contact points to an external circuit may extend in a lateral direction that is perpendicular to the height direction of the optical pickup, and the remaining wires may extend in a second direction opposite to a first direction corresponding to a direction toward an objective lens of the optical pickup.

The plurality of contact points may be formed in two lines that face the plurality of lands, wires extending from contact points arranged on a line that is closer to the objective lens may extend in the lateral direction, and wires extending from contact points arranged on a line that is farther from the objective lens may extend in the second direction.

A height of the photodetector unit in the height direction of the optical pickup may be 1.75 mm or less.

The optical pickup may further comprise a reinforcing plate installed upright on a base, wherein the photodetector unit is installed on the reinforcing plate.

A height of the reinforcing plate in the height direction of the optical pickup may be 2.15 mm or less.

In an aspect, there is provided an optical information storage medium system including an optical pickup which is installed to be movable in a radial direction of an information storage medium and which reproduces information from and/or records information to the information storage medium, and a control unit which controls the optical pickup.

A height of the photodetector unit in the height direction of the optical pickup may be 1.75 mm or less.

The optical information storage medium system may further comprise a reinforcing plate installed upright on a base, wherein the photodetector unit is installed on the reinforcing plate.

A height of the reinforcing plate in the height direction of the optical pickup may be 2.15 mm or less.

Other features and aspects may be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 1:
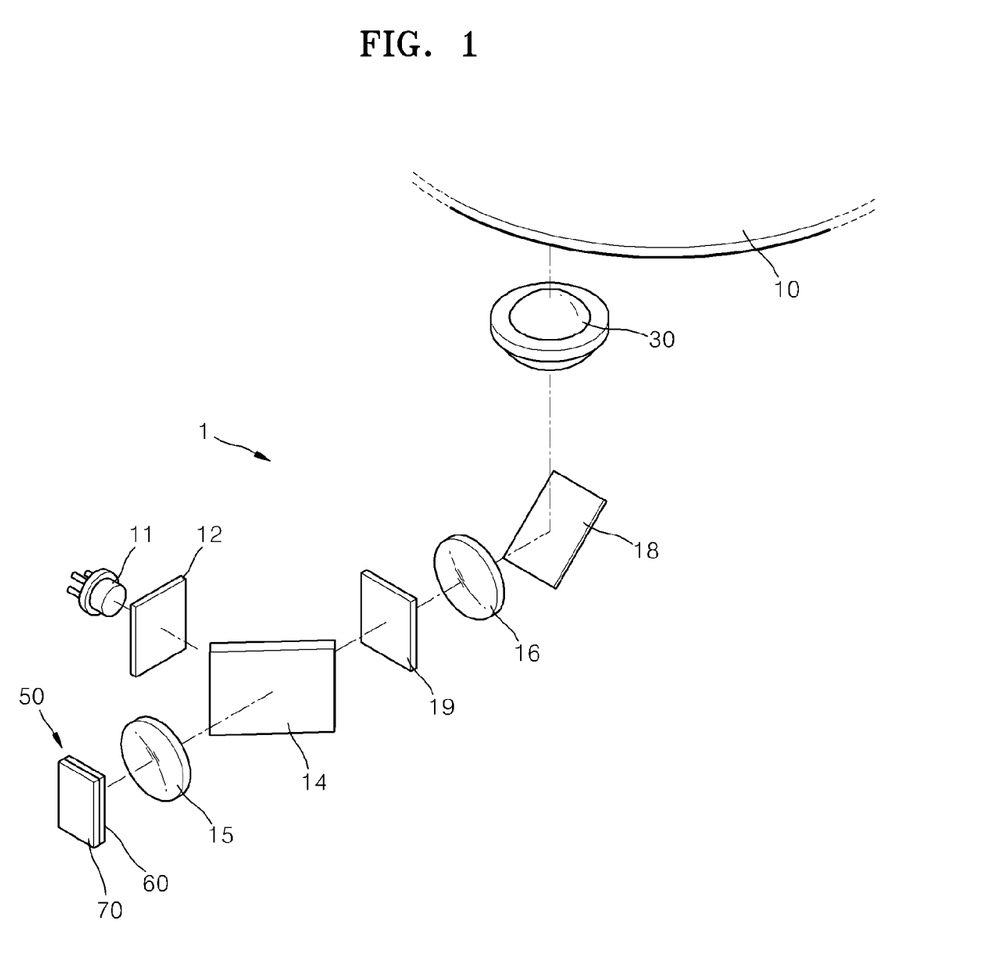
FIG. 1 is a diagram illustrating an example of an optical pickup including a photodetector unit.
Figure 2:
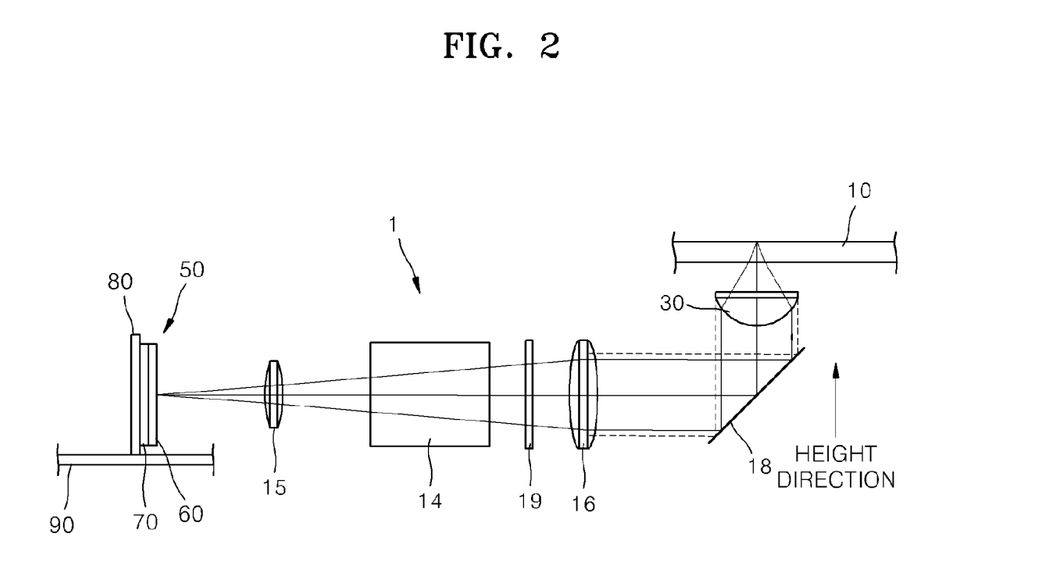
FIG. 2 is a side view illustrating an example of the optical pickup of FIG. 1.

FIG. 1 illustrates an example of an optical pickup 1 including a photodetector unit 50, and FIG. 2 is a side view that illustrates an example of the optical pickup 1 shown in FIG. 1.

Referring to FIGS. 1 and 2, the optical pickup 1 includes a light source 11, an objective lens 30 which condenses incident light on an information storage medium 10, a collimating lens 16 which collimates light emitted from the light source 11 so that the light is incident upon the objective lens 30, a optical path changer 14 which changes the path of an incident light beam, the photodetector unit 50 which receives light reflected by the information storage medium 10, and a detection lens 15 which allows the light reflected by the optical information storage medium 10 to be incident on the photodetector unit 50. For example, the photodetector unit 50 may use the received light to detect an information signal, an error signal, and the like, from the information storage medium 10.

The light source 11 may emit light of a predetermined wavelength range. For example, the light source 11 may include a blue light source which emits light in a blue wavelength range according to a Blu-ray disc (BD) standard, for example, light with a wavelength of about 405 nm. As another example, light source 11 may include a dual-wavelength light source (e.g., a twin-LD) which emits light of a red wavelength and light of an infrared wavelength, for example, light with a wavelength of about 650 nm and light with a wavelength of about 780 nm, to be compatible with a digital versatile disc (DVD) and a compact disc (CD). It should also be appreciated that the light source 11 may include three light sources, corresponding to blue light, red light, and infrared light.

The objective lens 30 may focus light emitted from the light source 11 to form a light spot on the information storage medium 10. For example, the objective lens 30 may have a numerical aperture that satisfies a BD standard, and/or may allow a DVD and a CD to be compatibly adopted.

For example, when the light source 11 emits light in a blue wavelength range and the objective lens 30 has a high numerical aperture of 0.85 or the like, the optical pickup 1 may record and/or reproduce data to and/or from a high-density information storage medium such as an optical disc following the BD standard. In addition, when the light source 11 emits light in a red wavelength range and light in an infrared wavelength range and the objective lens 30 has a numerical aperture for both a DVD and a CD, the optical pickup 1 may record and/or reproduce data to and/or from a DVD and a CD.

The wavelength of light emitted by the light source 11 and the numerical aperture of the objective lens 30 may vary, and the optical configurations of the optical pickup 1 may also vary. The illustrations herein are merely for purposes of example.

For example, in order to compatibly use BDs and DVDs, the optical pickup 1 may include light sources that provide a plurality of wavelengths, for example, a light source that provides a blue wavelength suitable for high-density optical discs and a light source that provides a red wavelength suitable for DVDs. Also, the optical pickup 1 may configure the objective lens 30 to attain an effective numerical aperture suitable for BDs and DVDs or may include a separate member for adjusting the effective numerical aperture of the objective lens 30.

In addition, the optical pickup 1 may record and/or reproduce data to and/or from high-density optical discs using the optical configuration of FIG. 1 and may further include an additional optical configuration for recording and/or reproducing data to and/or from DVDs and/or CDs. As another example, the optical pickup 1 may record and/or reproduce data to and/or from DVDs and/or CDs using the optical configuration of FIG. 1 and may further include an additional optical configuration for recording and/or reproducing data to and/or from high-density optical information storage media, such as, BDs.

In other words, the optical pickup 1 may further include a numerical aperture adjusting member or another objective lens in addition to the objective lens 30 in order to compatibly adopt BDs, DVDs, and CDs. Moreover, the optical pickup 1 may further include another light source in addition to the light source 11 in order to compatibly adopt BDs, DVDs, and CDs.

When data is recorded/reproduced to/from a DVD and a CD using the optical configuration of FIG. 1, a 2-wavelength light source such as a twin LD, for both DVDs and CDs, may be used as the light source 11.

The collimating lens 16 may collimate the light emitted from the light source 11 so that the light is incident upon the objective lens 30. The collimating lens 16 may be disposed between the optical path changer 14 and the objective lens 30.

The optical path changer 14 allows light received from the light source 11 to be directed toward the objective lens 30, and light reflected by the information storage medium 10 to be directed toward the photodetector unit 50. As an example, the optical path changer 14 may be a polarization-dependent optical path changer for changing an optical path of incident light according to polarization, for example, a polarizing beam splitter.

A quarter-wave plate 19 for changing the polarization of incident light may be further installed on an optical path between the polarizing beam splitter and the objective lens 30. FIGS. 1 and 2 illustrate examples in which the quarter-wave plate 19 is disposed between the polarizing beam splitter and the collimating lens 16, but as another example, the quarter-wave plate 19 may be disposed between the collimating lens 16 and the objective lens 30.

When the optical pickup 1 includes the polarizing beam splitter and the quarter-wave plate 19, first linearly polarized light emitted from the light source 11 and incident upon the polarizing beam splitter may be reflected by an inclined surface of the polarizing beam splitter and may be changed to first circularly-polarized light while passing through the quarter-wave plate 19. The first circularly-polarized light may be directed toward the information storage medium 10. The first circularly-polarized light may be changed to second circularly-polarized light when reflected by the information storage medium 10, and the second circularly-polarized light may be changed to second linearly polarized light while passing through the quarter-wave plate 19. The second linearly polarized light may be transmitted through the inclined surface of the polarizing beam splitter and may be directed toward the photodetector unit 50.

For example, the polarization-dependent optical path changer may be a polarizing hologram device capable of transmitting first polarized light emitted from the light source 11 and diffracting second polarized light reflected by the optical information storage medium 10 into a +1 order or a −1 order. When the polarizing hologram device is used as the polarization-dependent optical path changer, the light source 11 and the photodetector unit 50 may be optically modularized.

As another example, instead of the polarization-dependent optical path changer, the optical path changer 14 may include a beam splitter for transmitting and reflecting incident light at a predetermined ratio or a hologram device capable of transmitting the light emitted from the light source 11 and diffracting the light reflected by the optical information storage medium 10 into a +1 order or a −1 order. When the hologram device is used as the optical path changer 14, the light source 11 and the photodetector unit 50 may be optically modularized.

The optical pickup 1 may further include a grating 12 which may be used to split a light beam emitted from the light source 11 into an $0^{th}$-order light beam (i.e., a main light beam) and $\pm 1^{st}$-order light beams (i.e., sub light beams) in order to detect a tracking error signal according to a three-beam method, a differential push-pull method, and the like. A reproduction signal may be obtained from a detection signal of a $0^{th}$-order light beam reflected by the information storage medium 10, and the tracking error signal may be obtained according to an operation of the detection signal of the $0^{th}$-order light beam and a detection signal of $\pm 1^{st}$-order light beams reflected by the information storage medium 10. In FIGS. 1 and 2, reference numeral 18 denotes a reflection mirror for changing the path of light.

The detection lens 15 allows light that is reflected by the information storage medium 10, and which is received via the objective lens 30 and the collimating lens 16, to be incident as a light spot upon the photodetector unit 50. For example, the detection lens 15 may be an astigmatic lens which generates astigmatism to detect a focusing error signal using an astigmatism method.

The photodetector unit 50 may include a photodetector integrated circuit (PDIC) 60 which includes a plurality of lands 69 (see FIG. 4) that are used to detect the light reflected by the optical information storage medium 10. The photodetector unit 50 may further include a printed circuit board (PCB) 70, which is coupled to the PDIC 60 to contact the lands 69. For example, the PCB 70 may be a flexible PCB.

When a flexible PCB is used as the PCB 70, a reinforcing plate 80 for supporting the PCB 70 may be further included. For example, an optical system of the optical pickup 1, including the photodetector unit 50, may be arranged on a plane on a base 90, except for the objective lens 30. In this example, the reinforcing plate 80 may be installed upright on the base 90, and the photodetector unit 50 may be installed on the reinforcing plate 80. A portion of the base 90 on which the reinforcing plate 80 is installed is illustrated in the example of FIG. 2 for convenience of explanation. Although the photodetector unit 50 includes the PDIC 60 and the PCB 70 in the present example, the photodetector unit 50 may further include the reinforcing plate 80. As another example, the photodetector unit 50 may not include the PCB 70.

Figure 3:
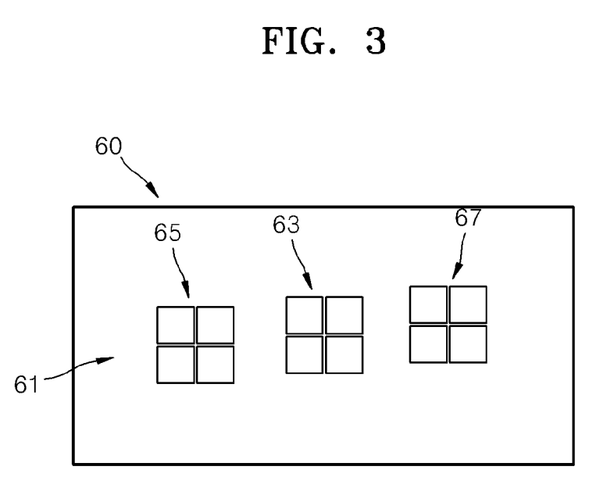
FIG. 3 is a diagram illustrating an example of a pattern of a light-receiving portion on a front side of a photodetector integrated circuit (PDIC) of the photodetector unit.
Figure 4:
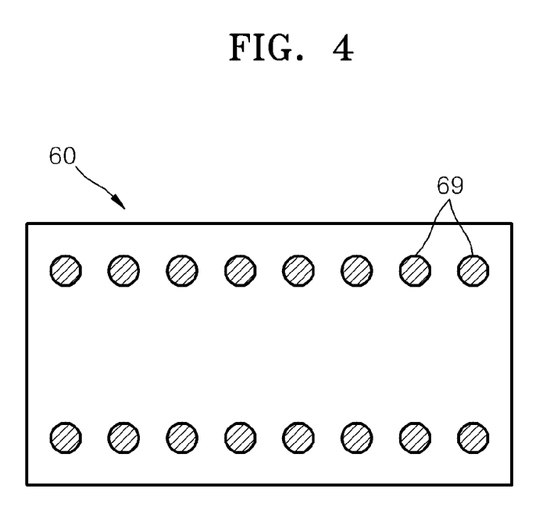
FIG. 4 is a diagram illustrating an example of a plurality of lands arranged on a back side of the PDIC of the photodetector unit.

FIG. 3 illustrates an example of a pattern of a light-receiving portion 61 of a front side of the PDIC 60 of the photodetector unit 50. FIG. 4 illustrates an example of the lands 69, which are arranged on a back side of the PDIC 60 of the photodetector unit 50.

Referring to FIGS. 3 and 4, the PDIC 60 includes the light-receiving portion 61, which receives the light reflected by the information storage medium 10, and a plurality of lands 69 which transform the light received by the light-receiving part 61 into electricity to generate a detection signal and which outputs the detection signal. The lands 69 may be used as terminals for outputting the detection signal. The PDIC 60 may be packaged, and may include the light-receiving portion 61 formed on its front side and the lands 69 formed on its back side. The lands 69 may be used as input/output terminals of the PDIC 60. According to the photodetector unit 50, the lands 69 may be arranged to form two lines in a height direction of the optical pickup.

Referring to the example of FIG. 3, the light-receiving portion 61 includes a main light-receiving part 63, and sub light-receiving parts 65 and 67 respectively arranged on both sides of the main light-receiving part 63. Each of the main light-receiving part 63 and the sub light-receiving parts 65 and 67 has a plurality of sectional light-receiving areas. For example, each of the main light-receiving part 63 and the sub light-receiving parts 65 and 67 may include four sectional light-receiving areas. In this case, the PDIC 60 includes a total of twelve sectional light-receiving areas. The PDIC 60 may detect light incident upon each of the sectional areas of the main light-receiving part 63 and the sub light-receiving parts 65 and 67 to detect a detection signal of the detected light, and may output the detection signal. To perform the signal detection and the signal output, the PDIC 60 may be electrically connected to an external circuit via the lands 69. In this example, the light-receiving parts include four light-receiving areas. It should be appreciated however, that the light-receiving parts may include more or less light-receiving areas. It should also be appreciated that one or more of the light-receiving areas may include a different number of light-receiving parts than the other light-receiving areas.

As illustrated in FIG. 3, when each of the main light-receiving part 63 and the sub light-receiving parts 65 and 67 includes four sectional light-receiving areas, the PDIC 60 requires a minimum of about 14 to 16 input/output terminals, and thus a number of lands 69 equal to the number of input/ output terminals may be formed on the rear side of the PDIC 60. FIG. 4 illustrates an example in which sixteen lands 69 are arranged in two lines.

For example, if the light-receiving part 61 of the PDIC 60 includes the main light-receiving part 63 and the sub light-receiving parts 65 and 67, each having four sectional light-receiving areas, detection signals corresponding to the four sectional light-receiving areas of the main light-receiving part 63 may be referred to as A, B, C, and D, detection signals corresponding to the four sectional light-receiving areas of the sub light-receiving part 65 may be referred to as E, F, G, and H, and detection signals corresponding to the four sectional light-receiving areas of the sub light-receiving part 67 may be referred to as I, J, K, and L. As an example, eight terminals may be used to output signals A, B, C, D, E+I, F+J, G+K, and H+L. The remaining terminals may be used in a power source Vcc, ground, a switch, and the like.

Figure 5:
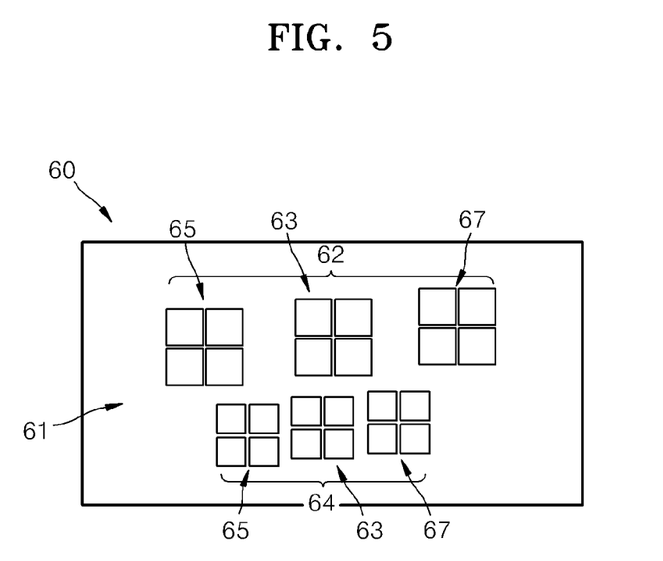
FIG. 5 is a diagram illustrating another example of a pattern of a light-receiving portion on the front side of the PDIC of the photodetector unit.

FIG. 5 illustrates another example of a pattern of a light-receiving portion on the front side of the PDIC of the photodetector unit.

In the example of FIG. 5, the light-receiving portion 61 includes first and second light-receiving parts 62 and 64 each including the main light-receiving part 63 and the sub light-receiving parts 65 and 67. Even with the increase in sub light-receiving parts, about sixteen terminals as illustrated in FIG. 4 is enough for the number of input/output terminals of the PDIC 60. For example, the first light-receiving part 62 may be for DVDs and the second light-receiving part 64 may be for CDs. Accordingly, the same terminal may be shared due to switch change between DVD recording/reproduction and CD recording/reproduction.

In the example of FIG. 5, the first light-receiving part 62 may be used to detect an information signal and/or an error signal during BD and DVD recording/reproduction, and the second light-receiving part 64 may be used to detect an information signal and/or an error signal during CD recording/reproduction.

Figure 6:
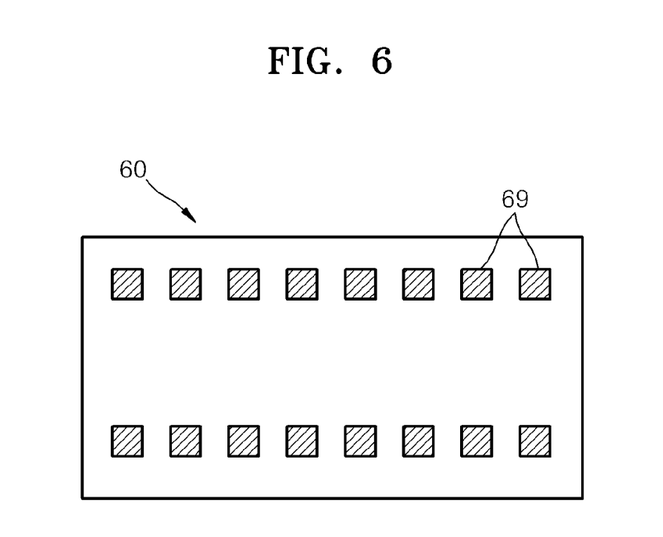
FIGS. 6, 7A, and 7B are diagrams illustrating examples of a plurality of lands arranged on the back side of the PDIC of the photodetector unit.

Although FIG. 4 illustrates the lands 69 having a circular shape, the shape of each of the lands 69 may vary. For example, as illustrated in FIG. 6, each of the lands 69 may be square.

Figure 7A:
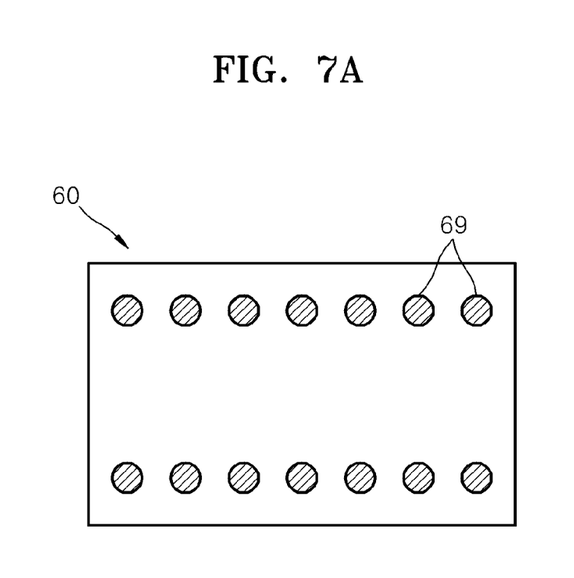
Figure 7B:
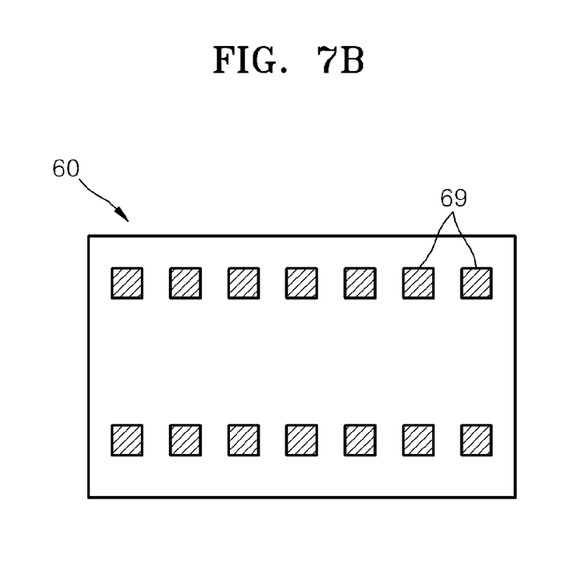

As another example, if the optical pickup 1 is only for reproduction, the PDIC 60 may include fourteen lands 69, as illustrated in FIGS. 7A and 7B. In this example, an optical pickup designated for only reproduction does not require two switch terminals for gain change, accordingly, two less terminals are needed. Of course, when the optical pickup 1 using the photodetector unit 50 is capable of both recording and reproduction, a gain-changing switch may be used in consideration of high power, and thus about sixteen input/output terminals may be used.

An example in which the PDIC 60 includes sixteen input/output terminals is hereinafter illustrated, but embodiments of the present invention are not limited thereto.

Figure 8:
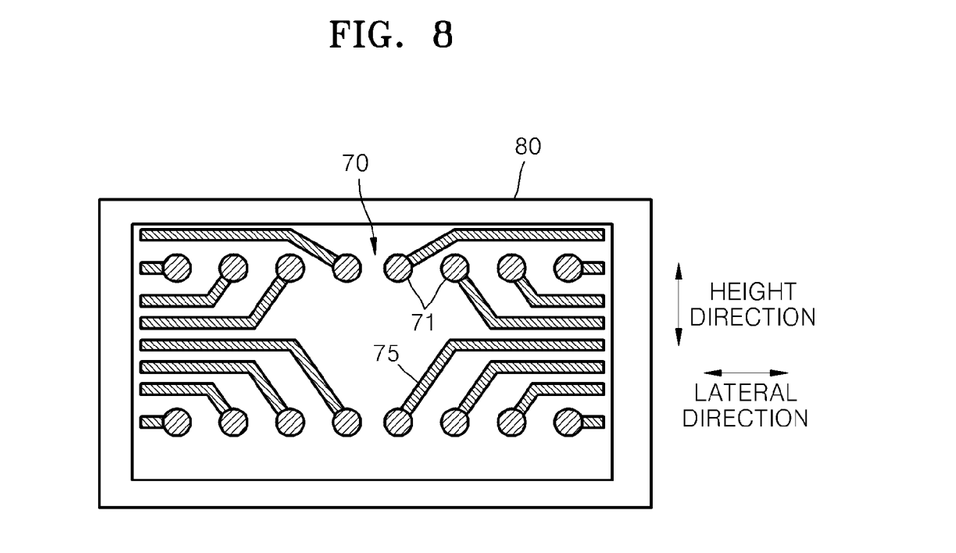
FIGS. 8 and 9 are diagrams illustrating examples of a printed circuit board (PCB) of the photodetector unit.
Figure 9:
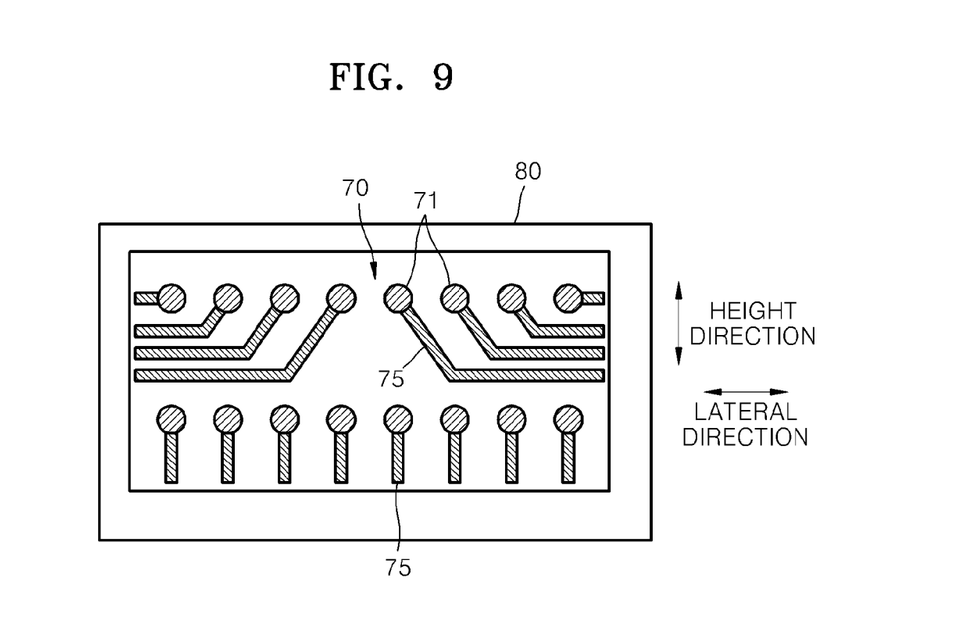

FIGS. 8 and 9 illustrate examples of a printed circuit board (PCB) of the photodetector unit.

The PDIC 60 may be coupled to the PCB 70 and may be electrically connected thereto. For example, the PCB 70 may include a plurality of contact points 71, which are installed at locations facing the lands 69 of the PDIC 60 so as to contact the lands 69, as illustrated in FIGS. 8 and 9. The PCB 70 may also include wires 75 to connect the contact points 71 to an external circuit. FIGS. 8 and 9 illustrate the PCB 70 mounted to the reinforcing plate 80.

As illustrated in FIG. 8, the wires 75 may be formed to extend in a lateral direction which is crossed to the height direction of the optical pickup 1. In other words, when the photodetector unit 50 is installed in the optical pickup 1, the PCB 70 may be mounted upright on the base 90 of the optical pickup 1 such that the wires 75 extend in the lateral direction, which is parallel to the base 90.

As illustrated in FIG. 9, some of the wires 75 may be arranged to extend in the lateral direction, which is across the height direction of the optical pickup 1. The remaining wires 75 may be arranged to extend in a second direction that is opposite to a first direction corresponding to a direction toward the objective lens 30 of the optical pickup 1 (i.e., upwards in FIG. 2). The second direction is a direction toward the base 90 of the optical pickup 1 (i.e., downwards in FIG. 2).

For example, the contact points 71 may be formed in two lines so as to face the lands 69, the wires 75 extending from contact points 71 arranged on a line relatively close to the objective lens 30 may extend in a lateral direction, and the wires 75 extending from contact points 71 arranged on a line relatively far from the objective lens 30 may extend in a second direction.

As illustrated in FIG. 9, when the wires 75 connected to the contact points 71 on the upper line extend in the lateral direction and the wires 75 connected to the contact points 71 on the lower line extend downwards, the distance between the two lines of the contact points 71 may be reduced. Accordingly, the width of the PCB 70 in the height direction may be reduced, and the width of the photodetector unit 50 in the height direction may also be reduced.

For example, the width of the photodetector unit 50 including the PCB 70 in the height direction of the optical pickup 1 may be about 1.75 mm or less. The width of the reinforcing plate 80, on which the photodetector unit 50 is installed, in the height direction of the optical pickup 1 may be about 2.15 mm or less.

As illustrated in FIGS. 8 and 9, the wires 75 of the PCB 70 may be formed so that the width of the PCB 70 in the height direction of the optical pickup 1 is about 1.75 mm or less, and thus the photodetector unit 50 including the PCB 70 may satisfy a sufficient-thickness to be used in slim portable apparatuses such as ultra books. To be applied to ultra books and the like, the optical pickup 1 should have a thickness of about 2.55 mm or less. That is, the photodetector unit 50, including the reinforcing plate 80, should be formed to have a height of a minimum of about 2.15 mm or less, in consideration of an adjustment margin. According to various aspects, a width of the photodetector unit 50 that satisfies the above-described conditions may be about 1.75 mm or less, in consideration of the manufacturing tolerance of the PCB 70.

According to various aspects, the plurality of lands 69 of the PDIC 60 may be arranged in two lines, and the wires 75 connected to the contact points 71 located on the PCB 70 to face the lands 69 may be arranged as shown in FIGS. 8 and 9. Thus, the width of the photodetector unit 50 in the height direction of the optical pickup 1 may be about 1.75 mm or less. The width of the reinforcing plate 80, on which the photodetector unit 50 is installed, in the height direction of the optical pickup 1 may be about 2.15 mm or less.

Accordingly, an optical pickup using the photodetector unit 50 as described above may become slim. For example, when the photodetector unit 50 is used, an optical pickup applicable to ultra books may be obtained. According to various aspects, the optical pickup may be used in a slim drive with a thickness of about 12.7 mm and an ultra-slim drive with a thickness of about 9.5 mm. Also, the slim optical pickup may be used in other slim portable apparatuses.

Figure 10:
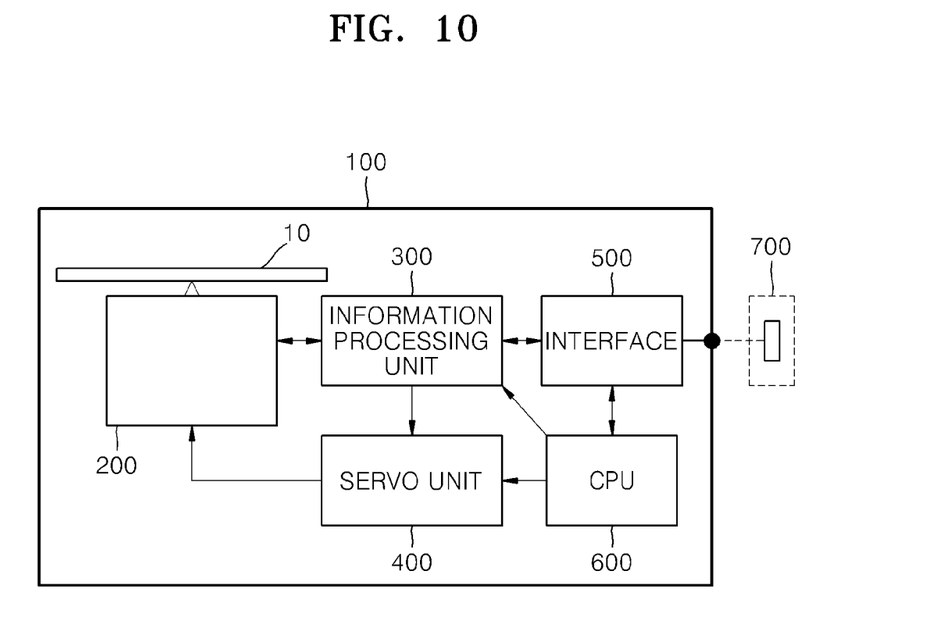
FIG. 10 is a diagram illustrating an example of an optical system including a compatible optical pickup.

FIG. 10 illustrates an example of an optical system 100 using a compatible optical pickup 200.

Referring to FIG. 10, the optical system 100 includes the compatible optical pickup 200, which is installed to be movable in a radial direction of the information storage medium 10 and reproduces information from and records information to the information storage medium 10, and a control unit 600 for controlling the compatible optical pickup 200.

The compatible optical pickup 200 may include an optical system as described herein with reference to FIGS. 1-9, and a mechanical system which mechanically supports the optical system and creates a focusing operation and a tracking operation.

The optical system may include an encoder/decoder and may be connected to an information processing unit 300 connected to an interface 500 for connecting the information processing unit 300 to an external host (not shown). The mechanical system may be connected to a servo unit 400. The information processing unit 300, the servo unit 400, and the interface 500 are controlled by the control unit 600 such as a central processing unit (CPU). The interface 500 may follow various standards and includes, for example, a universal serial bus (USB) port. Thus, the interface 500 is connected to a host, for example, a computer 700, according to a USB protocol to transmit and receive information to and from the computer 700.

A photodetector unit according to various aspects may reduce a height of an optical pickup by improving the arrangement of lands of a PDIC and accordingly improving the contact points and wires of a corresponding PCB. Accordingly, the height of an optical pickup using this photodetector unit may be reduced, and thus an ultra-slim optical information storage medium system may be obtained.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A photodetector integrated circuit (PDIC) for an optical pickup, the PDIC comprising:
a light-receiving portion comprising a main light-receiving part and sub light-receiving parts respectively disposed on opposing sides of the main light-receiving part, each of the main light-receiving part and the sub light-receiving parts comprising a plurality of sectional light-receiving areas; and
a plurality of lands which output a detection signal of light detected by each of the sectional light-receiving areas of the main light-receiving part and the sub light-receiving parts,
wherein the plurality of lands are arranged to form two lateral lines in a height direction of the optical pickup.

2. The PDIC of claim 1, further comprising a printed circuit board (PCB) which is coupled to the PDIC so as to contact the plurality of lands.

3. The PDIC of claim 2, wherein the PCB comprises a flexible PCB.

4. The PDIC of claim 2, wherein the PCB comprises a plurality of contact points that contact the plurality of lands, and wires formed on the PCB to connect the plurality of contact points to an external circuit extend in a lateral direction that is perpendicular to the height direction of the optical pickup.

5. The PDIC of claim 2, wherein the PCB comprises a plurality of contact points that contact the plurality of lands, and some of a plurality of wires formed on the PCB to connect the plurality of contact points to an external circuit extend in a lateral direction that is perpendicular to the height direction of the optical pickup, and the remaining wires extend in a second direction opposite to a first direction corresponding to a direction toward an objective lens of the optical pickup.

6. The PDIC of claim 5, wherein the plurality of contact points are formed in two lines that face the plurality of lands, wires extending from contact points arranged on a line that is closer to the objective lens extend in the lateral direction, and wires extending from contact points arranged on a line that is farther from the objective lens extend in the second direction.

7. The PDIC of claim 1, wherein a height of the optical pickup is 1.75 mm or less.

8. An optical pickup comprising:
a light source;
an objective lens which focuses light emitted from the light source on an information storage medium; and
a photodetector unit which receives light reflected by the information storage medium to detect an information signal and/or an error signal,
wherein the photodetector unit comprises a photodetector integrated circuit (PDIC) comprising a light-receiving portion which comprises a main light-receiving part and sub light-receiving parts respectively disposed on opposing sides of the main light-receiving part, the main light-receiving part and the sub light-receiving parts each comprising a plurality of sectional light-receiving areas, and a plurality of lands which output a detection signal of light detected by each of the sectional light-receiving areas of the main light-receiving part and the sub light-receiving parts, and
the plurality of lands are arranged to form two parallel lines in a height direction of the optical pickup.

9. The optical pickup of claim 8, wherein the photodetector unit further comprises a printed circuit board (PCB) which is coupled to the PDIC so as to contact the plurality of lands, and the PCB comprises a flexible PCB.

10. The optical pickup of claim 9, wherein the PCB comprises a plurality of contact points that contact the plurality of lands, and wires formed on the PCB to connect the plurality of contact points to an external circuit extend in a lateral direction that is perpendicular to the height direction of the optical pickup.

11. The optical pickup of claim 9, wherein the PCB comprises a plurality of contact points that contact the plurality of lands, and some of a plurality of wires formed on the PCB to connect the plurality of contact points to an external circuit extend in a lateral direction that is perpendicular to the height direction of the optical pickup, and the remaining wires extend in a second direction opposite to a first direction corresponding to a direction toward an objective lens of the optical pickup.

12. The optical pickup of claim 11, wherein the plurality of contact points are formed in two lines that face the plurality of lands, wires extending from contact points arranged on a line that is closer to the objective lens extend in the lateral direction, and wires extending from contact points arranged on a line that is farther from the objective lens extend in the second direction.

13. The optical pickup of claim 8, wherein a height of the photodetector unit in the height direction of the optical pickup is 1.75 mm or less.

14. The optical pickup of claim 13, further comprising a reinforcing plate installed upright on a base, wherein the photodetector unit is installed on the reinforcing plate.

15. The optical pickup of claim 14, wherein a height of the reinforcing plate in the height direction of the optical pickup is 2.15 mm or less.

16. An optical information storage medium system comprising:
   an optical pickup of claim 8 which is installed to be movable in a radial direction of an information storage medium and which reproduces information from and/or records information to the information storage medium; and
   a control unit which controls the optical pickup.

17. The optical information storage medium system of claim 15, wherein a height of the photodetector unit in the height direction of the optical pickup is 1.75 mm or less.

18. The optical information storage medium system of claim 16, further comprising a reinforcing plate installed upright on a base, wherein the photodetector unit is installed on the reinforcing plate.

19. The optical information storage medium system of claim 18, wherein a height of the reinforcing plate in the height direction of the optical pickup is 2.15 mm or less.

20. A circuit for an optical pickup comprising:
   a light-receiving portion comprising a main light-receiving part and sub light-receiving parts respectively disposed on opposing sides of the main light-receiving part, each of the main light-receiving part and the sub light-receiving parts comprising a plurality of sectional light-receiving areas; and
   a plurality of lands arranged to form two lateral lines in a height direction of the optical pickup to output a detection signal in response to light being detected by each of the sectional light-receiving areas of the main light-receiving part and the sub light-receiving parts.

* * * * *